United States Patent [19]

Kiluk

[11] Patent Number: 4,990,893
[45] Date of Patent: Feb. 5, 1991

[54] METHOD IN ALARM SYSTEM, INCLUDING RECORDING OF ENERGY CONSUMPTION

[76] Inventor: Czeslaw Kiluk, Frihetsvagen 63, Nacka 131 47, Stockholm, Sweden

[21] Appl. No.: 435,452

[22] PCT Filed: Apr. 29, 1988

[86] PCT No.: PCT/SE88/00221
§ 371 Date: Nov. 14, 1989
§ 102(e) Date: Nov. 14, 1989

[87] PCT Pub. No.: WO88/08596
PCT Pub. Date: Nov. 3, 1988

[30] Foreign Application Priority Data
Apr. 29, 1987 [SE] Sweden .................... 8701789

[51] Int. Cl.⁵ .................................. G08B 21/00
[52] U.S. Cl. .................. 340/573; 324/103 R; 324/113; 340/664; 364/554
[58] Field of Search .............. 340/573, 664; 324/113, 324/103 R; 364/554

[56] References Cited

U.S. PATENT DOCUMENTS

| | | | |
|---|---|---|---|
| 4,012,732 | 3/1977 | Herrick | 340/573 |
| 4,147,978 | 4/1979 | Hicks | 324/142 |
| 4,253,151 | 2/1981 | Bouve | 324/116 |
| 4,524,243 | 6/1985 | Shapiro | 340/573 |
| 4,568,934 | 2/1986 | Allgood | 340/870.02 |
| 4,858,141 | 8/1989 | Hart et al. | 340/664 |

FOREIGN PATENT DOCUMENTS 0049659 4/1982 European Pat. Off. .
355683 4/1973 Sweden .

Primary Examiner—Glen R. Swann, III
Attorney, Agent, or Firm—Flynn, Thiel, Boutell & Tanis

[57] ABSTRACT

A method for an alarm system is intended in particular for the monitoring of service apartments for elderly and/or handicapped persons. The energy consumption of each apartment is recorded over a period, for example in a computer. The results are presented in the form of a reference curve or standard curve for each apartment. Thereafter the actual energy consumption is compared with the value for the normal curve, and alarms of various kinds and of various degrees of urgency are triggered if the values differ by a predetermined amount.

17 Claims, 2 Drawing Sheets

METHOD IN ALARM SYSTEM, INCLUDING RECORDING OF ENERGY CONSUMPTION

FIELD OF THE INVENTION

The present invention relates to a method for an alarm system, intended in particular for the monitoring of service apartments.

BACKGROUND OF THE INVENTION

Apartments intended for elderly and/or handicapped persons are now usually equipped with alarm devices, for example alarm buttons, which can be positioned next to the bed, in the bathroom and/or immediately above floor-level at various points in the apartment.

Also previously disclosed (see Swedish Publication No. 355 683) is the execution of alarm systems connected to the toilet flushing system. The manner in which the system functions is that the alarm is given if flushing does not take place for a certain period.

Alarm systems are also familiar in industry. See European Patent No. 0 049 659, which relates to the acoustical monitoring of industrial installations, whereby unforeseen phenomena are detected by the measurement and signal processing of sound waves at different sensor locations.

The alarm systems referred to above suffer from certain disadvantages and do not solve problems which can occur in the circumstances described above. For example, appliances, hot plates or irons can be left on by mistake, resulting in overheating and the risk of fire. The previously disclosed systems are also unable to show whether the occupant of the apartment has modified his/her pattern of living, for example by using the cooker and other appliances at unusual times, which may be taken as an indication that everything is not right. Furthermore, the previously disclosed systems do not indicate with sufficient rapidity any deviations from the normal pattern of behaviour. For example, if the occupant of the apartment falls and is unable to reach the alarm button, it can take many hours, and even up to 24 hours, before the toilet flush alarm is triggered and help arrives.

SUMMARY OF THE INVENTION

The present invention indicates a method for an alarm system which rapidly triggers an alarm if changes take place compared with what is the normal pattern for the apartment. These alarms can be of different kinds, depending on the degree of urgency. It is thus possible, with the help of the invention, to establish whether, and to trigger an alarm of a certain type in the appropriate case, the consumption of electricity during a certain period is higher than normal, which can be caused by leaving an appliance, etc., switched on by mistake. Low electricity consumption during a certain period can also be identified, indicating that the occupant of the apartment is ill, and initiating a different type of alarm. An alarm can also be triggered if an increase in electricity consumption, which is normal at lunchtime, for example, does not occur or is chronologically displaced, which can also be taken as an indication that the occupant of the apartment is not well.

The alarm system in accordance with one embodiment of the invention functions in the following manner. The energy consumption of the apartment in question is recorded in a computer over a period of several weeks. The results are presented in the form of a reference curve or standard curve for each apartment. Extreme values or values which occur only occasionally are filtered out in conjunction with this. Thereafter the actual energy consumption is compared with the standard curve, for example with a reading being taken every minute. Alarms of different kinds are triggered if the values differ by a predetermined amount.

The characterizing features of the invention can be appreciated from the following Patent Claims.

BRIEF DESCRIPTION OF THE DRAWINGS

The invention is now described in greater detail with reference to the accompanying drawings, which relate to one embodiment of the invention.

DETAILED DESCRIPTION

Figure 1:
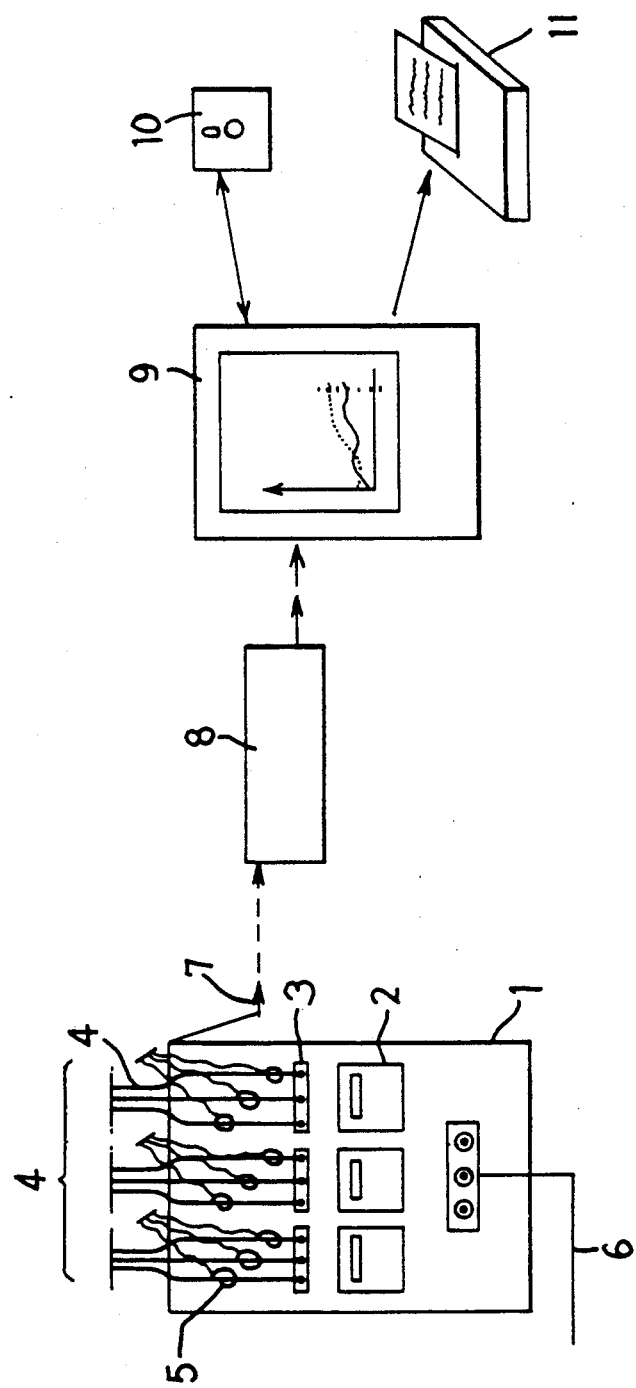
FIG. 1 shows a block diagram of one embodiment of the invention.

The system illustrated in FIG. 1 consists of an electricity supply cabinet 1, which may be common to the entire building, with an electricity supply cable 6 and an electricity meter 2 for each apartment. Each electricity meter 2 has a number of electrical fuses 3 which are connected electrically 4 to the consumer appliances in the apartment, such as lamps, cooker, refrigerator and coffee maker, etc. Sensors 5 are fitted to the electrical conductors 4 from the electrical control cabinet to the apartments. These sensors are not indicated in detail, but may consist of signal generators and pulse generators, etc.

The signal emitted by the sensors 5 is a low-voltage signal 7 which is directly proportional to the actual strength of the current in the electrical conductor 4 which supplies the apartment in question with electricity (220 V). The signal emitted by the sensor is transmitted via a signal converter 8, which converts the signal into digital form. The signals are also identified by the sensor number and are transmitted onwards to a computer 9.

Figure 2:
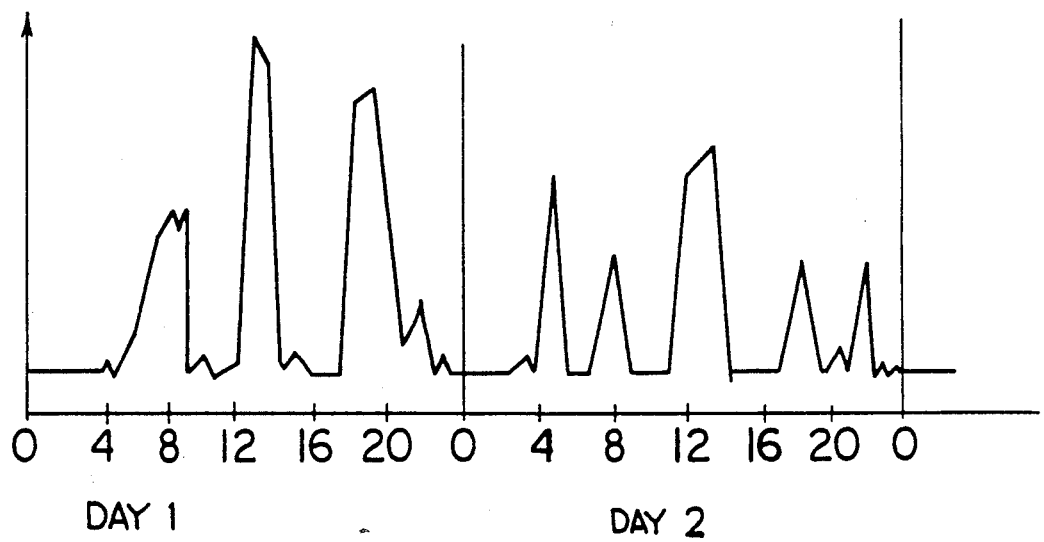
FIG. 2 shows a curve for the actual electricity consumption.

Once it has arrived at the computer 9, the signal is supplemented by an actual time indication from the clock of the computer, whereupon the signal and the time indication are stored in a disc memory 10, on the one hand for immediate processing, and on the other hand for subsequent processing. The immediate processing of the collected data can take place, for example, by producing a curve for the electricity consumption in the apartment in question, as shown in FIG. 2. In subsequent processing, curves relating to several days are combined to produce a common curve which constitutes a standard curve 12 for the apartment; see FIG. 3. Processing can also be executed in other ways: as graphs and tables, etc. Connected to the computer is a printer 11 for printing out the desired information. The standard curve 12 referred to above provides a reference value for immediate signal processing; i.e. every time the computer recognizes a signal from the apartment, its value 13 is compared with the value of the standard curve at the same point in time. If the actual signal value differs from the reference value, an evaluation is made with the help of a computer program, in conjunction with which the size of the difference and the duration of the difference are determined. A decision as to whether or not an alarm is to be triggered is taken on the basis of the result of the evaluation. These alarms can be of different types, for example A, B or C. The alarms thus have different degrees of urgency, as previously mentioned. See also the following criteria.

FIG. 1 illustrates in accordance with the foregoing an embodiment in which the electricity consumption of an apartment is recorded and is used as a reference value. Nevertheless the system can, of course, still be used with other forms of energy, such as gas consumption, and for recording water consumption with the help of sensors of an appropriate kind.

The system can also be applied to the remote monitoring of the electricity consumption of apartments. Monitoring of this kind may be of value in conjunction with the new form of care which means that elderly and/or handicapped persons are to be permitted to a greater extent than at present to live in their own apartments or bungalows. The remote monitoring of a number of apartments simultaneously can thus take place with the help of screens which, for each apartment, show the standard curve 12 and the continuous actual curve 13 for the energy consumption. Any differences between the curves can thus easily be read off directly by an operator.

Figure 3:
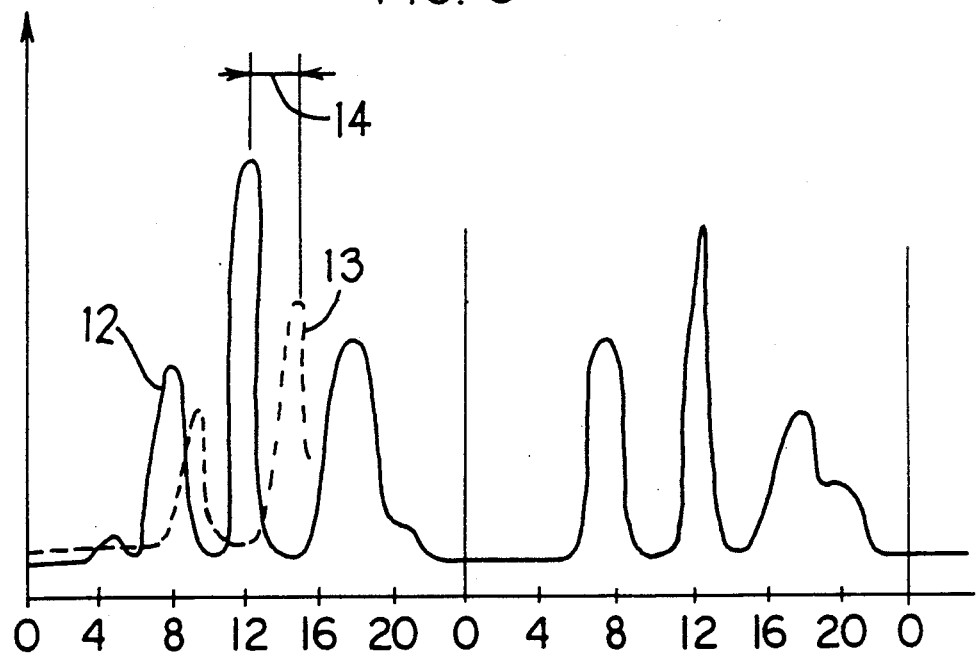
FIG. 3 shows a curve for the normal distribution of the electricity consumption.

FIG. 2 shows a curve for the electricity consumption in an apartment over a period of two days. Electricity consumption peaks occur during this period, representing "breakfast", "lunch" and "dinner". Curves of the kind illustrated in FIG. 2 are plotted for each week, and extreme values or values which occur only occasionally are filtered out. The curves for the two most recent weeks, for example, are then combined to produce a common weekly curve, which constitutes the reference curve or standard curve 12 for the apartment, as shown in FIG. 3. The curve 13 represented by a broken line shows the actual electricity consumption which, on the basis of a reading taken every minute, runs alongside the standard curve 12. It is thus an easy matter for any differences to be identified, such as the delay 14 in the "lunchtime peak" on the actual curve 13. This graphical read-out can be supplemented by data recording with pre-programmed threshold limit values for the criteria described below and the triggering of alarms with different degrees of urgency, A, B, C, in accordance with the foregoing.

A further advantage associated with the alarm system in accordance with the invention is that the standard curve 12 for the power consumption by the apartment in question is based on observations taken, for example, over the last two weeks, with the result that it is modified in line with the time of year and changes in living habits, etc. These changes thus modify the standard curve with regard to frequency and amplitude. In the event of a major deviation occurring on a single occasion only, this will be perceived as a "spurious effect" and not as a signal which contributes to the pattern. In other words, the computer program will perform a frequency analysis of the incoming signals. It is then possible, on the basis of the signal analysis, to determine the size and/or the duration of the deviations for the different types of alarm: A, B or C.

Signal analysis and signal processing can be applied appropriately in accordance with three criteria:
1. A comparison between the level of the standard curve and the level of the continuous actual curve, in conjunction with which the values for triggering the alarm can be determined under operating conditions.
2. Time-related assessment of the signal duration (e.g. cooker switched on).
3. Assessment of the probability of the level of the signal and the duration of the signal.

The system is not, of course, restricted only to the purposes indicated above, but can also be applied in other areas, including rehabilitation, or, for example, to the analysis of periods during which food is taken, etc., which can be of importance in conjunction with medical examinations, etc.

The embodiments of the invention in which an exclusive property or privilege is claimed are defined as follows:

1. Method for an alarm system, intended in particular for the monitoring of service apartments and the like for elderly and/or handicapped persons, characterized in that the system is connected to the energy supply system of the apartment, or to a part thereof, for the purpose of recording the distribution of energy consumption during certain periods, in that the result of the recordings is produced in the form of a cumulative recording exhibiting an average distribution pattern, in that the actual distribution pattern is recorded and is compared with the recorded average distribution pattern, and in that an alarm is produced if, at the end of or during a period, the values for the average distribution pattern and the actual distribution pattern differ by a predetermined amount.

2. Method according to claim 1, characterized in that sensors connected to the electricity supply system of the apartment emit signals which correspond to the electricity consumption of the apartment, which signals are converted to digital form in a signal converter and are recorded together with a time indication in the memory of a computer.

3. Method according to claim 2, characterized in that the average distribution pattern is retrieved from the memory of the computer in the form of a curve representing the normal pattern of electricity consumption during said period.

4. Method according to claim 3, characterized in that the curves showing the average distribution pattern and the continuous actual distribution pattern of electricity consumption are displayed simultaneously, overlapping one another, on a screen, thus enabling continuous reading and comparison to be made, for example in an alarm control centre.

5. Method according to claim 1, characterized in that the actual distribution pattern of energy consumption is compared with the average distribution pattern of energy consumption at the same point in time, and in that different types of alarm are emitted in response to, for example, the difference in : (A) the level of consumption, (B) the duration of the consumption and/or (C) the point in time at which it occurs.

6. Method according to claim 1, characterized in that an alarm of a certain type is emitted if the actual distribution pattern of energy consumption during a predetermined period is lower than the average distribution pattern of consumption (indicating a low level of activity).

7. Method according to claim 1, characterized in that an alarm of a certain type is emitted if the actual distribution pattern of energy consumption during a predetermined period is higher than the average distribution pattern of consumption (indicating an appliance left switched on by mistake).

8. Method according to claim 1, characterized in that an alarm of a certain type is emitted if a peak in the actual distribution pattern of energy consumption does not occur or is chronologically displaced (indicating temporary illness).

9. A method for monitoring human activity in a dwelling, comprising the steps of: sensing the amount of electrical energy supplied to the dwelling on an electricity supply circuit, periodically recording an actual chronological pattern of energy consumption during a time period, comparing each said actual chronological pattern with an expected chronological pattern of energy consumption for said time period, and generating an alarm if said actual chronological pattern differs from said expected chronological pattern by a predetermined amount.

10. A method according to claim 9, wherein said sensing step includes the steps of providing on said electricity supply circuit for the dwelling a sensor which emits signals representing the electricity consumption in said circuit, converting signals from said sensor into digital signals in a signal converter, and recording said digital signals together with a time indication in the memory of a computer.

11. A method according to claim 10, wherein said comparing step includes the step of retrieving from the memory of the computer a curve representing said expected chronological pattern of electricity consumption during said time period.

12. A method according to claim 9, wherein said step of generating said alarm includes the step of selecting and generating one of a plurality of different types of alarms as a function of the difference in the level of consumption between said actual chronological pattern and said expected chronological pattern, the duration of the difference between said patterns, and the point in time at which the difference between said patterns occurs.

13. A method according to claim 9, including the step of simultaneously displaying curves representing said expected chronological pattern and said actual chronological pattern on a screen in an alarm control center.

14. A method according to claim 9, wherein said step of generating said alarm includes the step of generating an alarm of a predetermined type if the actual chronological pattern of energy consumption during a predetermined period is lower than the expected chronological pattern of consumption.

15. A method according to claim 9, wherein said step of generating said alarm includes the step of generating an alarm of a predetermined type if the actual chronological pattern of energy consumption during a predetermined period is higher than the expected chronological pattern of consumption.

16. Method according to claim 9, wherein said step of generating said alarm includes the step of generating an alarm of a predetermined type in response to one of a first condition and a second condition, said first condition existing where a peak in said expected chronological pattern of consumption does not occur in said actual chronological pattern of consumption, and said second condition existing where a peak in said actual chronological pattern of consumption is chronologically displaced from a corresponding peak in said expected chronological pattern of consumption.

17. A method according to claim 9, including the step of generating said expected chronological pattern of energy consumption from a plurality of said recorded actual chronological patterns of energy consumption.

* * * * *